United States Patent
Itoh et al.

(10) Patent No.: US 9,034,467 B2
(45) Date of Patent: May 19, 2015

(54) RETICLE CHUCK CLEANER

(75) Inventors: Masamitsu Itoh, Yokohama (JP); Katsuya Okumura, Tokyo (JP); Taro Inada, Shibukawa (JP); Jun Watanabe, Shibukawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 865 days.

(21) Appl. No.: 13/192,694

(22) Filed: Jul. 28, 2011

(65) Prior Publication Data
US 2012/0024318 A1 Feb. 2, 2012

(30) Foreign Application Priority Data

Jul. 28, 2010 (JP) ................................. 2010-169691

(51) Int. Cl.
- B32B 7/12 (2006.01)
- B08B 7/00 (2006.01)
- G03F 7/20 (2006.01)

(52) U.S. Cl.
CPC .............. B08B 7/0028 (2013.01); G03F 7/707 (2013.01); G03F 7/70925 (2013.01)

(58) Field of Classification Search
CPC .... B08B 7/0028; G03F 7/707; G03F 7/70925
USPC .................... 134/6; 427/58, 162, 207.1; 15/3; 428/343, 354
See application file for complete search history.

(56) References Cited

U.S. PATENT DOCUMENTS

| | | | |
|---|---|---|---|
| 2003/0136430 A1* | 7/2003 | Namikawa et al. | 134/32 |
| 2006/0162739 A1* | 7/2006 | Sogard | 134/1 |
| 2009/0269597 A1 | 10/2009 | Bito et al. | |
| 2011/0159440 A1 | 6/2011 | Nakajima et al. | |

FOREIGN PATENT DOCUMENTS

| | | |
|---|---|---|
| JP | 01-310565 | 12/1989 |
| JP | 2-266544 | 10/1990 |
| JP | 10-154686 | 6/1998 |
| JP | 2006-229122 | 8/2006 |
| JP | 2007-165699 | 6/2007 |
| JP | 2008-147337 | 6/2008 |
| JP | 2009-146959 | 7/2009 |
| JP | 2011134929 A | 7/2011 |
| WO | WO 01/04228 A1 | 1/2001 |
| WO | WO 2008/010494 A1 | 1/2008 |

OTHER PUBLICATIONS

First Office Action of the Japanese Patent Office related to Patent Application No. 2010-169691; filed Dec. 26, 2013; mailed Jan. 21, 2014 (Japanese version included, 11 pgs.).

Final Office Action of the Japanese Patent Office in Patent Application No. 2010-169691, mailed Oct. 7, 2014 (English-translation version included (7 pgs.)).

* cited by examiner

*Primary Examiner* — Xiao Zhao
(74) *Attorney, Agent, or Firm* — Finnegan, Henderson, Farabow, Garrett & Dunner, LLP

(57) ABSTRACT

According to one embodiment, a reticle chuck cleaner for cleaning a reticle chuck of an EUV exposure apparatus includes a substrate having a shape to be carried to the reticle chuck of the EUV exposure apparatus, and an adhesive formed on one of the main surfaces of the substrate.

5 Claims, 2 Drawing Sheets

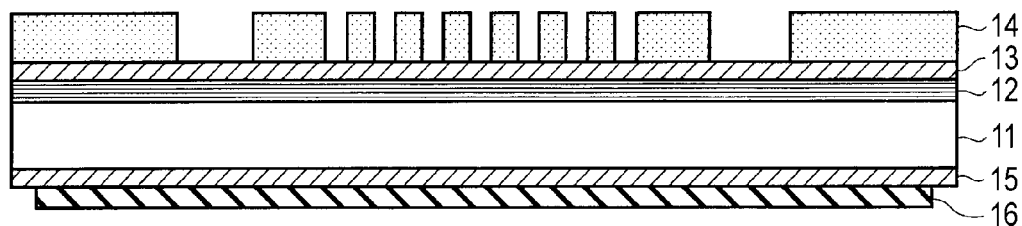
F I G. 1
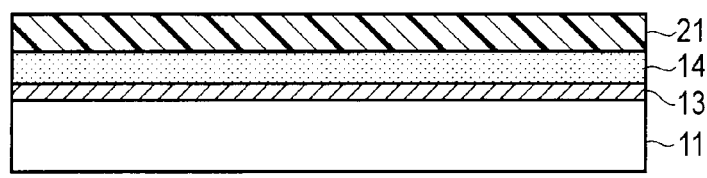
F I G. 2A
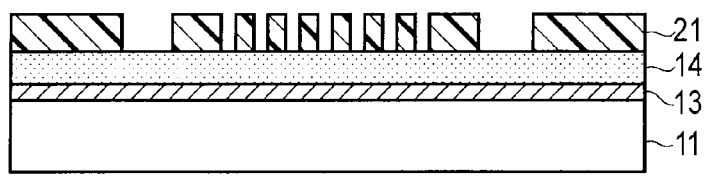
F I G. 2B
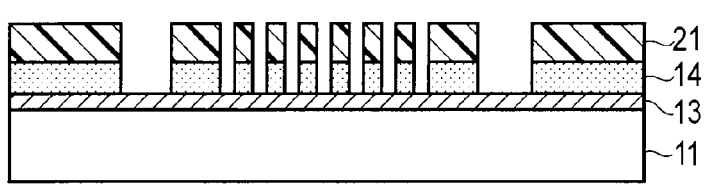
F I G. 2C
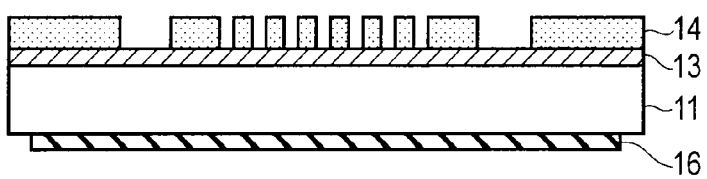
F I G. 2D

US 9,034,467 B2

RETICLE CHUCK CLEANER

CROSS-REFERENCE TO RELATED APPLICATIONS

This application is based upon and claims the benefit of priority from prior Japanese Patent Application No. 2010-169691, filed Jul. 28, 2010, the entire contents of which are incorporated herein by reference.

FIELD

Embodiments described herein relate generally to a reticle chuck cleaner that cleans the reticle chuck of an EUV exposure apparatus, a manufacturing method of the reticle chuck cleaner and a reticle chuck cleaning method.

BACKGROUND

Recently, extreme ultra-violet (EUV) lithography has come to be used with the miniaturization of semiconductor devices. The wavelength of EUV light is as short as 13.5 nm and the light is instantly attenuated in air. Therefore, it is required to incorporate an exposure optical system in vacuum in a wafer exposure apparatus (EUV scanner) using EUV light. In this case, since a reticle stage itself is placed in vacuum, a vacuum chuck cannot be used for a chucking mechanism of an EUV mask and an electrostatic chucking system is used. In the electrostatic chucking system, a chucking region with a larger area is required to provide the same holding power in comparison with a vacuum chucking system. Therefore, in the EUV mask, it is necessary to use a large portion of the backside surface thereof as a chucking region.

Thus, in the EUV lithography, since a large portion of the backside surface thereof is used as the chucking region, a foreign matter tends to be present on the surface of the chucking mechanism. If a foreign matter is sandwiched between the chucking mechanism and the EUV mask, the EUV mask is deformed and strain occurs on the pattern surface. As a result, there occurs a problem that a pattern transferred onto the wafer is strained. Further, since the chucking mechanism is provided in the large vacuum chamber, it is necessary to set the pressure in the vacuum chamber back to atmospheric pressure and perform a cleaning operation in order to eliminate the foreign matter. In this case, the stop time of the EUV scanner becomes long and mainly causes the operability of the EUV scanner to be lowered.

BRIEF DESCRIPTION OF THE DRAWINGS

FIG. 1 is a cross-sectional view showing the schematic structure of a reticle chuck cleaner according to a first embodiment.

FIGS. 2A, 2B, 2C and 2D are cross-sectional views showing the manufacturing steps of the reticle chuck cleaner of FIG. 1.

DETAILED DESCRIPTION

Figure 3A:
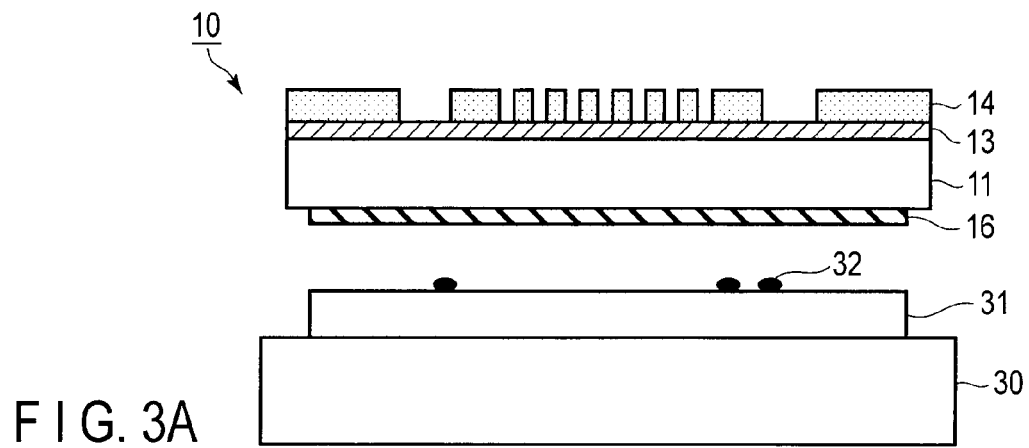
FIGS. 3A, 3B and 3C are cross-sectional views showing a process, for illustrating a reticle chuck cleaning method for an EUV exposure apparatus using the reticle chuck cleaner of FIG. 1.

In general, according to one embodiment, a reticle chuck cleaner for cleaning a reticle chuck of an EUV exposure apparatus includes a substrate having a shape to be carried to the reticle chuck of the EUV exposure apparatus, and an adhesive formed on one of the main surfaces of the substrate.

Next, the embodiment is explained with reference to the drawings.

(First Embodiment)

FIG. 1 is a cross-sectional view showing the schematic structure of a reticle chuck cleaner according to a first embodiment.

In FIG. 1, a symbol 11 denotes a quartz substrate. On the front surface of the substrate 11, a multi-layered film 12 functioning as a reflection film of EUV exposure and a capping layer 13 for surface protection are laminated in this order. On the capping layer 13, an alignment pattern formed of an optical absorption member 14 of tantalum or the like is formed. On the backside surface of the substrate 11, a chromium film 15 functioning as an electrode of an electrostatic chuck is formed. On the chromium film 15, an adhesive 16 containing an acrylate copolymer as a main component is formed.

The adhesive 16 is formed in a region other than regions of 5 mm from the end portions of the substrate 11 to prevent the adhesive from making contact with a holding member used for carrying the reticle chuck cleaner by means of various carriage mechanisms. That is, the adhesive 16 is not formed in portions that are held by means of the carriage mechanism at the carriage time. Further, the adhesive 16 is subjected to a process to prevent the adhesive from remaining on the electrostatic chuck and prevent discharge of a volatile substance.

The multi-layered film 12 can be formed of any type of film if the film functions as a reflection film and a multi-layered film formed of a molybdenum film and silicon film, for example, can be used. Further, the chromium film 15 can be formed of any type of film if the film functions as an electrode and a film containing chromium as a main component or another conductive film can be used. In addition, the adhesive 16 is not limited to a material containing an acrylate copolymer as a main component and may be a material having adhesion that is sufficient for adhering a foreign matter as will be described later and adhesion that does not cause the adhesive to be excessively strongly adhered to the reticle chuck.

Next, a manufacturing method of the reticle chuck cleaner of this embodiment is explained. FIGS. 2A to 2D are cross-sectional views showing the manufacturing steps of the reticle chuck cleaner.

First, as shown in FIG. 2A, an EUV mask blank coated with normal electron beam resist was prepared. For example, the EUV mask blank is formed as follows. That is, a multi-layered film 12 formed of a molybdenum film and silicon film is formed on one surface (front surface) of a low-thermal expansion glass substrate (or quartz substrate) with the thickness of 6.3 mm and 152 mm square and a film containing ruthenium as a main component and called a capping layer 13 is formed on the above film. Further, an absorption film 14 containing tantalum as a main component is formed on the capping layer 13 and resist 21 is coated on the absorption film 14. On the other surface (backside surface), a chromium film 15 is formed. The multi-layered film 12 and chromium film 15 are not necessarily provided in the cleaner and can be eliminated. Therefore, in FIG. 2A, the multi-layered film 12 and chromium film 15 are omitted.

Next, an alignment mark used at the carriage time or chucking time in the EUV exposure apparatus was drawn on the surface of the blank on which the resist 21 was coated by means of an electron beam drawing apparatus (for example, the EBM 7000 made by New Flare Technology Inc.). Then, a resist pattern was formed as shown in FIG. 2B by developing the resist 21.

Next, as shown in FIG. 2C, the tantalum absorption member 14 was selectively etched by a dry-etching method with the resist pattern used as an etching mask. Subsequently, the resist 21 was removed and a wet cleaning process was performed. Up to this step, the process is substantially the same as the forming method of an EUV mask that can be carried into the EUV exposure apparatus.

Next, as shown in FIG. 2D, a toluene/ethyl acetate solution of an adhesive 16 containing an acrylate copolymer as a main component and including an isocyanate compound as a cross-linker was spin-coated with the dry thickness of approximately 20 μm on a surface opposite to the surface on which the alignment mark was formed. As the acrylate copolymer, a monomer of Tg-68° C. that was a monomer containing 2-ethylhexyl acrylate as a main component was used. Further, as the cross-linker, Colonate L made by Japanese Polyurethane Industrial Co. was used. The adhesive 16 was formed by blowing hot air at 100° C. for one minute to eliminate the above solution. After this, an unnecessary portion of the adhesive 16 was eliminated by cleaning a region of 5 mm from the end portion of the substrate 10 with methoxy propyl acetate. This process is performed to cope with a case wherein the regions of 5 mm from the mask end portions are held when the EUV mask is carried by means of various types of carriage mechanisms.

Next, a 7-day aging process was performed in an atmosphere of 45° C. with respect to the reticle chuck cleaner shown in FIG. 2D. In the aging process, cross-linking took place in the adhesive 16 by storing the adhesive 16 in a heating atmosphere to enhance the cohesive power of the adhesive layer. The adhesive 16 could be prevented from remaining on the electrostatic chuck. Then, the reticle chuck cleaner was stored in vacuum for two hours while being heated at 150° C. to perform a process of eliminating a volatile component from the adhesive 16. The volatile substance can be prevented from being discharged in the EUV exposure apparatus by the above process. If the heating process is not performed in vacuum, the outgas amount of hydrocarbon-series in vacuum is $3 \times 10^{-5}$ mbar·l/s. On the other hand, the outgas amount of hydrocarbon-series after the heating process in vacuum is $8 \times 10^{-8}$ mbar·l/s and can be reduced to approximately 1/300th the amount when the heating process is not performed in vacuum.

Figure 3B:
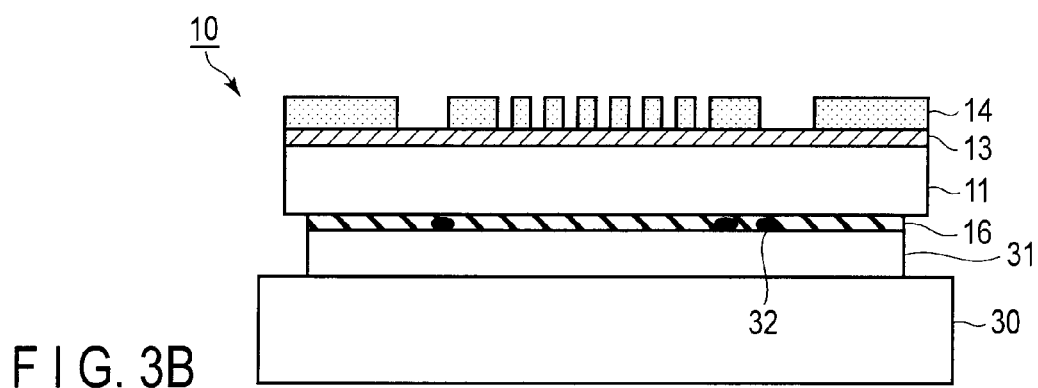
Figure 3C:
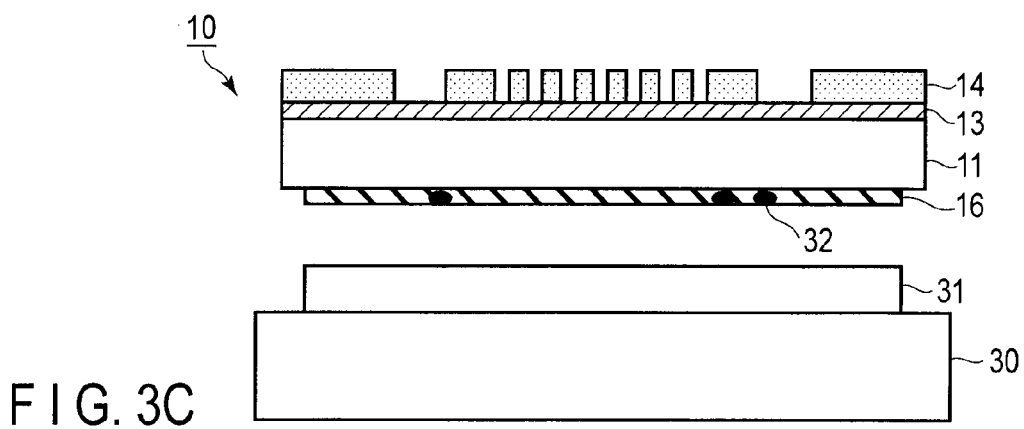

Next, a cleaning method using the reticle chuck cleaner of this embodiment is explained. FIGS. 3A to 3C are cross-sectional views showing a process of the cleaning method.

The reticle chuck cleaner 10 formed in the process shown in FIGS. 2A to 2C was inserted in a double pod (made by Integris Co.) for an EUV mask (not shown) and set as it is in a reticle port of the EUV exposure apparatus (for example, the NXE 3100 made by ASML Co.). Then, it was carried like the reticle carriage case. Since an alignment mark is formed on the pattern surface of the reticle chuck cleaner 10 of this embodiment, the cleaner can be carried into the vacuum chamber of the exposure apparatus like the normal reticle carriage case. Then, the reticle chuck cleaner 10 reaches the reticle chucking stage in approximately five minutes.

Next, as shown in FIG. 3A, the reticle chuck cleaner 10 is brought closer to a reticle chuck 31 by performing the same operation as the reticle chucking operation. In this case, the reticle chuck 31 is placed on a reticle stage 30 and is made slightly smaller than a reticle used to set a large portion of the backside surface of the reticle as a chucking region. Specifically, an EUV mask of 152 mm square is provided and a chucking region of 132 mm square is formed. Further, a voltage used for the electrostatic chuck can be applied to the reticle chuck 31 by means of a power source (not shown).

Then, as shown in FIG. 3B, the backside surface of the reticle chuck cleaner 10 is closely adhered to the reticle chuck 31. At this time, a foreign matter 32 on the reticle chuck 31 sinks into the adhesive 16 and taken in the adhesive 16. At this time, a voltage may be applied to the reticle chuck 31 to temporarily electrostatically chuck the reticle chuck cleaner 10 on the reticle chuck 31.

After close adhesion for approximately ten minutes, the reticle chuck cleaner 10 is removed from the reticle chuck 31. At this time, as shown in FIG. 3C, the foreign matter 32 sinking in the adhesive 16 is eliminated as it is together with the adhesive 16 from the reticle chuck 31. Then, the reticle chuck cleaner 10 is set back to the original reticle port.

As described above, the reticle chuck 31 can be cleaned for approximately 20 minutes with the vacuum state of the vacuum chamber of the EUV exposure apparatus kept maintained simply by performing the separation operation after closely adhering the adhesive 16 on the backside surface side of the cleaner 10 onto the front surface of the reticle chuck 31 by means of the reticle chuck cleaner 10 of this embodiment.

On the other hand, conventionally, since the reticle chuck 31 is present in the vacuum chamber, the cleaning operation is performed after the pressure of the vacuum chamber is once set back to atmospheric pressure and the reticle chuck 31 is taken out from the vacuum chamber. Therefore, it is forced to stop the operation of the apparatus for approximately 48 hours. As a result, semiconductor devices cannot be manufactured during this time, leading to a rise in the manufacturing cost of the semiconductor devices.

Thus, according to this embodiment, the reticle chuck 31 can be cleaned without returning the pressure of the vacuum chamber of the EUV exposure apparatus to atmospheric pressure and the operability of the EUV exposure apparatus can be greatly improved. Therefore, the efficiency of the semiconductor device manufacturing method using the EUV exposure apparatus can be markedly enhanced and the cost thereof can be greatly reduced.

Further, in this embodiment, the reticle chuck cleaner in which the adhesive 16 is formed is subjected to a heating process under vacuum, and therefore, emission gas from the adhesive 16 can be made as little as possible. As a result, it is possible to extremely reduce the risk of discharging a hydrocarbon-series contaminated substance into an EUV scanner to the minimum. Additionally, the area of an adhesive coating region is set equal to or slightly larger than the 132 mm square of the chucking region and set smaller than the 152 mm square of the substrate 11. Therefore, the adhesive 16 is not brought into contact with an arm of a carriage robot of a mask and the entire surface of the reticle chuck can be cleaned.

(Modification)

This invention is not limited to the above embodiment. In the embodiment, the electron beam drawing apparatus is used to form the alignment mark, but it is not limited to the above apparatus and a laser beam drawing apparatus can be used. Further, as the substrate for the reticle chuck cleaner, it is possible use not a normal EUV mask blank but a blank having no multi-layered film or buffer layer. Further, reticle carriage can be made possible even if no alignment mark is provided depending on the EUV exposure apparatus and, in such a case, it is unnecessary to form an alignment mark.

As the adhesive, an acryl-series, urethane-series, silicone-series or the like can be used. Further, the adhesive is not necessarily directly formed on the backside surface of the substrate and may previously be coated on a separation film with desired thickness and then adhered to the backside surface of the substrate with desired size. In this embodiment, the adhesive is eliminated in the regions of 5 mm from the end portions of the substrate, but can be eliminated only in a portion with which the holding portion used when the adhesive is carried by means of the carriage mechanism is made contact.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A reticle chuck cleaner comprising:
    a substrate having a shape to be carried to a reticle chuck of an EUV exposure apparatus,
    an adhesive formed on one of main surfaces of the substrate, and
    an alignment mark used at the carriage time of a reticle of the EUV exposure apparatus is formed on a surface of the substrate that is opposite to the surface on which the adhesive is formed,
    wherein a multi-layered film functioning as a reflection layer, a capping layer for surface protection and a pattern of an optical absorption member are formed on the surface of the substrate that is opposite to the surface on which the adhesive is formed, and the alignment mark is formed of the pattern of the optical absorption member.

2. The cleaner according to claim 1, wherein a region in which the adhesive is formed is not smaller than a chucking region of the reticle chuck of the EUV exposure apparatus.

3. The cleaner according to claim 1, wherein the adhesive is not formed in a portion that is held by a carriage mechanism at the carriage time.

4. The cleaner according to claim 1, wherein the adhesive is one of acrylic, urethane and silicone.

5. The cleaner according to claim 1, wherein a metal film is formed as an electrode of an electrostatic chuck on one surface of the substrate and the adhesive is formed on the metal film.

* * * * *